United States Patent [19]

Smits

[11] Patent Number: 5,250,473

[45] Date of Patent: Oct. 5, 1993

[54] METHOD OF PROVIDING SILICON DIOXIDE LAYER ON A SUBSTRATE BY MEANS OF CHEMICAL REACTION FROM THE VAPOR PHASE AT A LOW PRESSURE (LPCVD)

[75] Inventor: Jacobus W. M. Smits, Eindhoven, Netherlands

[73] Assignee: U.S. Philips Corp., New York, N.Y.

[21] Appl. No.: 739,624

[22] Filed: Aug. 2, 1991

[30] Foreign Application Priority Data

Aug. 6, 1990 [NL] Netherlands ............... 9001770

[51] Int. Cl.[5] ............... H01L 21/00; H01L 21/02; H01L 21/20; H01L 21/205
[52] U.S. Cl. ............... 437/238; 437/235; 427/96; 427/585
[58] Field of Search ............... 437/225, 228, 235, 238; 427/99

[56] References Cited

U.S. PATENT DOCUMENTS 4,810,673  3/1989  Freeman ............... 437/238

OTHER PUBLICATIONS

Smits, Method of providing a silicon dioxide layer on a substrate by means of chemical reaction from the vapour phase at a low pressure (LPCVD), CA116(22):225393u, 1992.
Sze, VLSI Technology, McGraw-Hill, 1988, p. 249.

Primary Examiner—Brian E. Hearn
Assistant Examiner—B. Everhart
Attorney, Agent, or Firm—Ernestine C. Bartlett

[57] ABSTRACT

A LPCVD-process for $SiO_2$-layers at a deposition temperature between 420° C. and 500° C., using a silane compound in which only one H and one Cl-atom is bonded to the Si-atom yields a very satisfactory uniformity of the layer thickness. An example of such a silane compound is dimethyl monochlorosilane.

12 Claims, 2 Drawing Sheets

METHOD OF PROVIDING SILICON DIOXIDE LAYER ON A SUBSTRATE BY MEANS OF CHEMICAL REACTION FROM THE VAPOR PHASE AT A LOW PRESSURE (LPCVD)

FIELD OF THE INVENTION

The invention relates to a method of providing a silicon dioxide layer on a substrate by means of chemical vapor deposition at a low pressure (LPCVD) from a mixture comprising an oxidizing agent and a chlorosilane.

The invention also relates to a method of manufacturing a semiconductor device which comprises a silicon dioxide layer.

BACKGROUND OF THE INVENTION

Silicon dioxide layers are widely used in the semiconductor industry as dielectric layers and passivation layers. Said layers are commonly provided by means of a LPCVD-process (As used herein, LPCVD means low pressure chemical vapour deposition). Such $SiO_2$ layers are also used in optical filters, the so-called interference filters. Low pressure is to be understood to means herein a pressure between $10^{-5}$ and 1 bar.

In such a process it is important for the reaction velocity to be kinetically controlled, which means that the reaction velocity is highly temperature-dependent. In that case, the $SiO_2$ layer formed has a uniform layer thickness and an excellent step coverage takes place. The latter property is important, in particular, in VLSI-applications in which complex geometries having dimensions of approximately 1 $\mu m$ must be provided with a $SiO_2$ layer having a uniform thickness.

The opposite of kinetically-controlled reactions is formed by diffusion-controlled reactions. Diffusion-controlled reactions or processes generally lead to a poorer uniformity of the layer thickness, measured both on one substrate and on different substrates in one batch. It has been found that a satisfactory uniformity can be obtained when the activation energy of the reaction exceeds 100 kJ/mol.

A method of providing a silicon dioxide layer on a substrate by LPCVD is described in British Patent Application UK-A 2061243. In the method described therein, a $SiO_2$ layer is formed by a reaction of silane ($SiH_4$) or dichlorosilane ($SiH_2Cl_2$) with an oxidizing agent such as NO or $N_2O_4$. The reaction takes place in the temperature range between 430° and 633° C. at a pressure of approximately 1 mbar. The activation energy of the reaction with $N_2O_4$ is 0.91 eV/molecule, which corresponds to 87.4 kJ/mol. Said British Patent Application makes no mention of the measured layer thickness on different substrates in one batch, nor does it mention the degree of step coverage.

In another known LPCVD-process, TEOS (tetraethyl orthosilicate) is used. This reaction is kinetically controlled, however, the process temperature must be at least 650° C. This means that the process is unsuitable for the application of a $SiO_2$-layer on aluminum and many silicides. Moreover, in this instance, glass cannot be used as the substrate. Another low-temperature process is based on, for example, DES (diethyl silane), however, said reaction is diffusion-controlled, which leads to a poor uniformity of the layer formed. An example of a kinetically-controlled, low-temperature LPCVD-process is a process which is based on DADBS (diacetoxy ditertiary butoxysilane). The layers formed have a satisfactory uniformity of the layer thickness, however, the deposition rate at 450° C. is only 2 nm/min. Besides, the $SiO_2$-layers formed exhibit a shrinkage of approximately 20% after annealing.

SUMMARY OF THE INVENTION

An object of the invention is to provide, inter alia, a method of applying a silicon-dioxide layer on a substrate by means of a LPCVD-process which can be carried out in the temperature range between 430° and 500° C. and which additionally exhibits a high deposition rate and an improved uniformity of the layer thickness.

According to the invention, this object is achieved by a method of providing a silicon dioxide layer on a substrate by means of a LPCVD-process from a mixture comprising an oxidizing agent and a chlorosilane, which method is characterized in that the chlorisilane is a monochlorosilane of the formula $R_1R_2SiHCl$, where $R_1$ and $R_2$ represent an alkyl group. Typical of this class of compounds is that only one H-atom and one Cl-atom are bonded to the central Si-atom. The two other positions of the Si-atom are occupied by alkyl groups. The alkyl groups may be the same or different Suitable alkyl groups are the methyl, ethyl, propyl and butyl groups. Said monochlorosilanes have the property that they can be oxidized at relatively low temperatures (<500° C.), while forming a $SiO_2$-layer with a very satisfactory step coverage. Using dimethyl monochlorosilane, the activation energy in the temperature range between 420° and 470° C. varies from 150 to 220 kJ/mol, which means that the process is kinetically controlled. A deposition rate of approximately 10 nm/min can be attained. When diethyl monochlorosilane is used, a lower process temperature can be used at a specific deposition rate, by virtue of the smaller Si-C bonding strength. Oxygen, $NO_2$ and $N_2O_4$ can for example be used as the oxidizing means in the LPCVD-process.

A suitable embodiment of the method according to the invention is characterized in that dimethyl monochlorosilane (($CH_3)_2SiHCl$) is used as the monochlorosilane. The vapor pressure at room temperature of this liquid compound is so high that no carrier gas is needed to transport the compound to the reactor. The reaction taking place during the LPCVD-process can be represented as follows: $(CH_3)_2SiHCl + O_2 \rightarrow SiO_2 + HCl + C_2H_6$.

A preferred embodiment of the method according to the invention is characterized in that the silicon dioxide layer is provided at a temperature between 420° and 500° C. Although the deposition of the $SiO_2$-layer can take place in the temperature range between 400° and 700° C., the above-mentioned temperature range is important, in particular, when the $SiO_2$-layer has to be deposited on materials which are not resistant to high temperatures, such as glass, aluminum and many silicides. In the preferred temperature range, the deposition rate is between 3 and 25 nm/min at an overall pressure in the reactor of 1.3 mbar.

In a suitable embodiment of the method according to the invention, a temperature in the reactor of 430° C. is used at an overall pressure of 1.3 mbar. Then, the deposition rate of the $SiO_2$-layer is 7 nm/min.

The method according to the invention is particularly suitable for the manufacture of a semiconductor device having a silicon dioxide layer. Semiconductor devices often comprise patterned tracks and contact surfaces of aluminum and silicides. Such materials are not resistant to the high temperatures occurring in the customary CVD-processes. At a process temperature below 500° C., the method according to the invention provides a satisfactory step coverage by the $SiO_2$-layer formed. The uniformity of the layer thickness of the $SiO_2$-layer within one batch is very satisfactory.

BRIEF DESCRIPTION OF THE DRAWINGS

The invention will be explained in greater detail by means of exemplary embodiments and with reference to the accompanying drawings, in which FIG. 1 diagrammatically shows a sectional view of a horizontal tube reactor.

DETAILED DESCRIPTION OF THE PREFERRED EMBODIMENTS

Exemplary Embodiment 1

Figure 1:
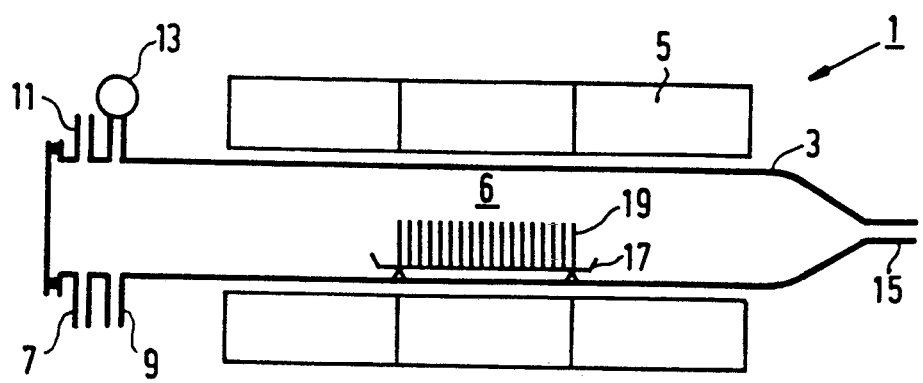

In FIG. 1, reference numeral 1 denotes a diagrammatic, sectional view of a horizontal tube reactor. The reactor comprises a quartz tube 3 having a length of approximately 1.5 m and an inside diameter of 100 mm. The tube 3 is surrounded by a three-zone resistance furnace 5 whose central zone surrounds the deposition zone 6. In the deposition zone, which has a length of approximately 50 cm, the temperature is measured and controlled by means of thermocouples (not shown). Monochlorosilane can be supplied to the reactor through a pipe 7, and oxygen and argon can be supplied through pipes 9 and 11, respectively. The flow rate of the gases is controlled by mass flow controllers (not shown). The overall pressure in the reactor is measured with a MKS baratron pressure gauge 13. The reactor is connected to a vacuum pump (not shown) via a pipe 15. A holder 17 which holds silicon wafers 19 is arranged in the reactor. The quartz tube is evacuated to a pressure of 0.01 mbar, after which argon is led through the tube until the temperature profile in the deposition zone 6 is completely flat and amounts to 430±1° C. The argon flow is stopped and dimethyl monochlorosilane (Petrarch Systems) is fed into the reactor through the pipe 7. The vessel containing dimethyl monochlorosilane is at room temperature. The mass flow of the dimethyl monochlorosilane is controlled by a needle valve (not shown) in the pipe 7 and is adjusted to 28 sccm (standard $cm^3$ per minute). The deposition of $SiO_2$ takes place by leading oxygen into the reactor through the pipe 9. The mass flow of oxygen is adjusted to 125 sccm. The overall pressure in the reactor is adjusted to 1.3 mbar by means of nitrogen. For this purpose, nitrogen is introduced at the port gate of the vacuum pump. Under these conditions, the deposition rate of the $SiO_2$ is 7 nm/min. The layer thicknesses of the $SiO_2$-layers are measured with an ellipsometer (Gaertner, type L 116 B). The variations in layer thickness within one wafer and within one batch are smaller than 2%.

Exemplary Embodiment 2

Figure 2:
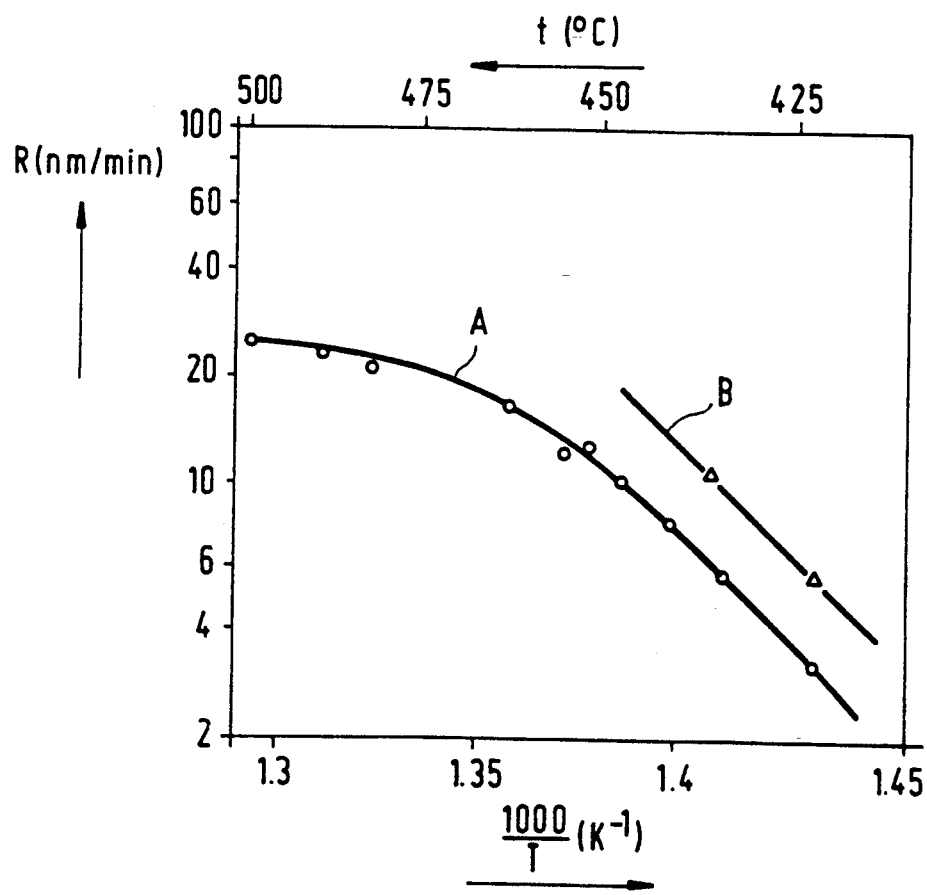
FIG. 2 shows an Arrhenius plot of the LPCVD-process according to the invention.

The above LPCVD-process is repeated at different temperatures in the temperature range between 420° and 500° C. In FIG. 2, the deposition rate R is plotted as a function of the reciprocal absolute temperature $T^{-1}$ (Arrhenius plot). The calculated activation energy varies between 220 kJ/mol at 430° and 150 kJ/mol at 470° C. Curve A shows the deposition rate at an overall pressure of 1.3 mbar. The deposition rate increases when the overall pressure is increased. Curve B is measured at an overall pressure of 2.0 mbar. FIG. 2 shows that a deposition rate of 10 nm/min can be realized at a process temperature of 430° C. and an overall pressure of 2.0 mbar.

IR-spectroscopy (Nicolet DX FTIR-spectrometer) shows that the deposited $SiO_2$-layers do not contain O-H bonds. The refractive index of the $SiO_2$-layers formed in the temperature range 420°–500° C. is constant and amounts to 1.44.

Rutherford backscattering analysis of a $SiO_2$-layer formed at 445° C. shows a stoichiometry of $SiO_{2.1}$ and a carbon content of approximately 0.1 at. %. The layer does not contain chlorine. When the layer is annealed in air at 800° C. for 15 minutes, a shrinkage of 10–15% occurs. The refractive index remains constant at 1.44. After annealing, the stoichiometry is exactly $SiO_2$ and the carbon has completely disappeared from the layer.

Exemplary Embodiment 3

Figure 3:
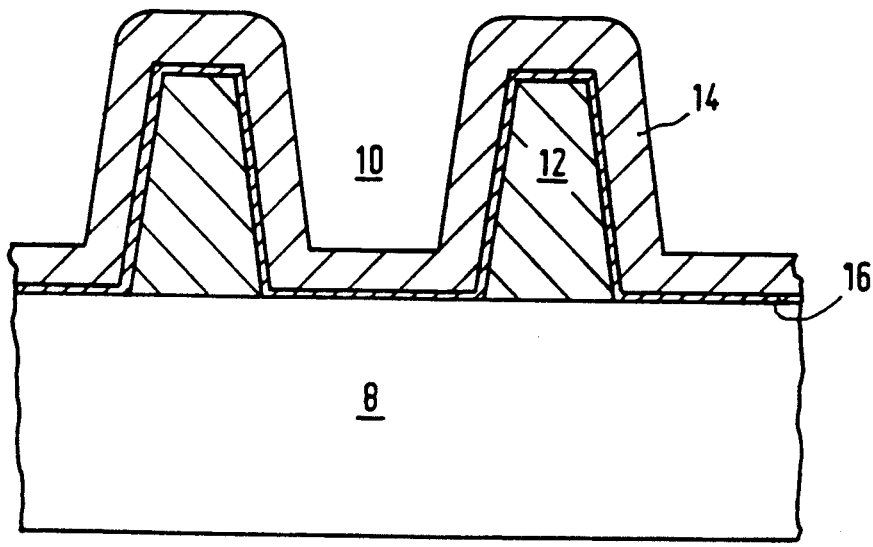
FIG. 3 shows a step-coverage with $SiO_2$ using the method according to the invention, and FIG. 4 diagrammatically shows a cross-sectional view of a SB-IGFET semiconductor device.

In FIG. 3, reference numeral 8 denotes a silicon substrate. A 1 μm thick layer of $SiO_2$ is deposited thereon by means of a CVD-process using TEOS at 750° C. By means of photolithography, said $SiO_2$ layer is provided with troughs 10 and dikes 12 according to a pattern. A 50 nm thick layer 16 of polysilicon is applied to said structure by means of a CVD-process. The width of the troughs 10 is approximately 1 82 m, and the width of the dikes 12 is approximately 0.5 μm. The aspect ratio of these patterns is 1. As in exemplary embodiment 1, an approximately 0.3 μm thick layer 14 of $SiO_2$ is deposited on this pattern by the method according to the invention. The step coverage of the $SiO_2$-layer 14 is excellent.

Exemplary Embodiment 4

Figure 4:
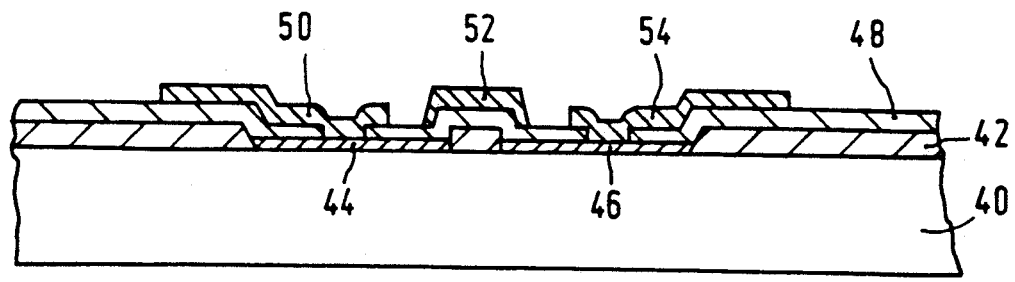

FIG. 4 is a diagrammatic sectional view of a SB-IGFET (Schottky barrier insulated gate field effect transistor). Said transistor is composed of a n-Si substrate 40 on which a layer of $SiO_2$ 42 is thermally grown. Said $SiO_2$-layer 42 is locally interrupted, PtSi-areas 44 and 46 being situated on the Si-substrate at the location of the interruptions. The structure is provided with a $SiO_2$-layer 48 by the method according to the invention. The layer is provided by means of dimethyl chlorosilane and oxygen at a temperature of 430° C. and an overall pressure of 1.3 mbar. The layer thickness is 0.5 μm. Subsequently, the structure is locally provided with aluminum by means of vacuum evaporation, thereby forming source, gate and drain contacts 50, 52 and 54, respectively. The advantage of the method according to the invention is the very satisfactory step coverage and the low process temperature, as a result of which the PtSi-layers are not degraded.

Comparative Example 5

Exemplary embodiment 1 is repeated using dichlorosilane. The other process conditions are identical. The use of both oxygen and $N_2O_4$ as the oxidizing agent results in a layer thickness variation within one batch of approximately 20%. When this result is compared to the layer thickness variation of less than 2% which is obtained when dimethyl monochlorosilane is used, it is apparent that the uniformity of the layer thickness has been greatly improved.

I claim:

1. A method of providing silicon dioxide layer having a substantially uniform thickness at an improved deposition rate on a substrate by means of chemical vapor deposition at a low pressure (LPCVD) from a mixture comprising an oxidizing agent and a chlorosilane, wherein the chlorosilane is a monochlorosilane of the formula $R_1R_2SiHCl$, where $R_1$ and $R_2$ represent an alkyl group and wherein the silicon dioxide layer may be deposited on various substrates including substrates comprising aluminum.

2. A method as claimed in claim 1, wherein dimethyl monochlorosilane is used as the monochlorosilane.

3. A method as claimed in claim 1, wherein the silicon dioxide layer is provided at a temperature between 420° and 500° C.

4. A method as claimed in claim 3, wherein a temperature of 430° C. is used.

5. A method as claimed in claim 4, wherein the silicon dioxide layer is applied at an overall pressure of 1.3 mbar.

6. A method of manufacturing a semiconductor device which comprises a silicon dioxide layer, wherein the silicon dioxide layer is manufactured by a method as claimed in claim 1.

7. A method as claimed in claim 2, wherein the silicon dioxide layer is provided at a temperature between 420° and 500° C.

8. A method of manufacturing a semiconductor device which comprises a silicon dioxide layer, wherein the silicon dioxide layer is manufactured by a method as claimed in claim 2.

9. A method of manufacturing a semiconductor device which comprises a silicon dioxide layer, wherein the silicon dioxide layer is manufactured by a method as claimed in claim 3.

10. A method of manufacturing a semiconductor device which comprises a silicon dioxide layer, wherein the silicon dioxide layer is manufactured by a method as claimed in claim 4.

11. A method of manufacturing a semiconductor device which comprises a silicon dioxide layer, wherein the silicon dioxide layer is manufactured by a method as claimed in claim 5.

12. A method of manufacturing a semiconductor device which comprises a silicon dioxide layer, wherein the silicon dioxide layer is manufactured by a method as claimed in claim 7.

* * * * *